United States Patent [19]

Mecklenburg

[11] Patent Number: 4,547,728
[45] Date of Patent: Oct. 15, 1985

[54] RF WATTMETER
[75] Inventor: Frank H. Mecklenburg, Chagrin Falls, Ohio
[73] Assignee: Bird Electronic Corporation, Solon, Ohio
[21] Appl. No.: 413,537
[22] Filed: Aug. 31, 1982
[51] Int. Cl.$^4$ ............................................. G01R 21/04
[52] U.S. Cl. .................................. 324/95; 324/99 R; 324/119
[58] Field of Search ................ 324/58 B, 58 A, 58 R, 324/95, 99 R, 99 D, 119, 132

[56] References Cited
U.S. PATENT DOCUMENTS 3,142,799  7/1964  Kovalevski ...................... 324/99 R
4,080,566  3/1978  Mecklenburg ...................... 324/95
4,359,682  11/1982  Winslow ........................... 324/58 B

OTHER PUBLICATIONS

News From Rhode & Schwarz 60, Burkhart, D., "Directional Power Meter NAUS", vol. 13, 1973, pp. 13-15.

Primary Examiner—Stewart J. Levy
Assistant Examiner—S. Baker
Attorney, Agent, or Firm—Pearne, Gordon, Sessions, McCoy, Granger & Tilberry

[57] ABSTRACT

An RF wattmeter is disclosed of the type using an "insertion-type" pick-up element to produce a voltage wave signal corresponding to the measured power in the coaxial transmission line. The induction loop in the pick-up element is connected to a principal detector, and a secondary detector is connected in opposition to the principal detector. Both detectors are located in close proximity to each other and are subject to the same thermal environment. A sine wave generator supplies a wave signal to the secondary detector in opposition to the wave signal supplied to the principal detector from the inductive loop. The d.c. portion of the resulting signal representing the difference between the opposed signals is integrated, and the integrated output is used as the amplitude in the generated sine wave. When the circuit is in balance, the integrated output matches the amplitude of the inductive wave form and can be used as an output indicating measured power in the coaxial transmission line.

20 Claims, 6 Drawing Figures

RF WATTMETER

BACKGROUND OF THE INVENTION

1. Field of the Invention

This invention relates to electronic instruments for detecting and measuring RF voltage wave signals on coaxial transmission lines, such as between a transmitting antenna and a transmitter. More particularly, the invention relates to an "insertion-type" RF wattmeter for detecting and measuring the forward and reflected voltage wave signals on a coaxial transmission line.

2. Description of the Prior Art

Insertion-type directional RF wattmeters are used in many applications in the RF field, particularly in matching antennas to coaxial transmission lines and in minimizing the voltage standing wave ratio (VSWR) on coaxial lines. Meters currently available for this application are, for example, of the type disclosed in U.S. Pat. Nos. 2,852,741, 2,891,221, 4,080,566, 4,075,554 and 4,263,653.

The principle of operation of these units is based on the use of a rigid, coaxial line section that is inserted in the coaxial transmission line, such as by standard coaxial connectors, and an inductive pickup loop or coil that is positioned in a transverse opening in the outer conductor of the line section. This pickup coil is adapted for rotation about an axis normal to the axis of the line section and is connected by special leads to a D'Arsonval meter movement. The resulting meter reading indicates the magnitude of the wave signal in watts, the indication being either that of the magnitude of the forward voltage wave level or the reflected voltage wave level, depending upon the particular orientation of the pickup coil.

The pickup coil is located in the electrical field between the inner and outer conductors of a coaxial transmission line and has a voltage induced therein proportional to the current I in the inner conductor, there being a mutual inductance M between the loop and the transmission line and the loop being positioned in the plane of the inner conductor of the line. A series circuit of resistance R and capacitance C connected across the transmission line conductors will give a voltage across the resistance R proportional to the voltage E between the line conductors. In directional couplers and so-called reflectometers, these arrangements are combined in a sampling circuit in which the resistor R is connected in series with the loop, and capacitive coupling is provided as by capacitive plates or windings on the loop and the inner conductor or by capacitive effects between the components of the sampling circuit and the inner conductor.

Considering this sampling circuit and using lumped impedances, it is apparent that the mutual inductance M is either positive or negative, depending upon the directional relation between the loop and the wave signal energy traveling on the line.

The instrument described obtains reversal of the mutual inductance M through 180° rotation of the loop relative to the transmission line. The forward traveling wave has voltage $E_f$ and current $I_f$, while the reflected traveling wave has voltage $E_r$ and current $I_r$. Thus, if $Z_o$ is the characteristic impedance of the line, and $\rho$ is the reflection coefficient, $$\rho = \frac{E_r}{E_f} = -\frac{I_r}{I_f}$$

and $$e = j\omega(RCE_f + MI)$$

$$= j\omega E_f\left[ RC(1 + \rho) + \frac{M}{Z_o}(1 - \rho) \right]$$

where e is the total electromotive force induced in the loop or sampling circuit. The components are selected so that $$RC = \frac{M}{Z_o} = K$$

K being a constant. If $e^+$ is the electromotive force when M is positive, so that the voltage across R and the voltage induced in the loop are additive, and $e^-$ is the electromotive force when M is negative and the voltages referred to are opposed, the former gives a maximum and the latter a minimum indication, thus:

$$e^+ = j\omega E_f[K(1 + \rho) + K(1 - \rho)]$$
$$= 2j\omega E_f K$$

$$e^- = j\omega E_f[K(1 + \rho) - K(1 - \rho)]$$
$$= 2j\omega E_f K\rho$$

Thus the RF output voltage in the loop is directional and proportional to the voltage in the line due to either the forward or reflective wave, and from the loop voltage, measurements of the reflection coefficient and voltage standing wave ratio can be obtained.

It is also possible to measure the power P being fed through the transmission line $$P = EI \cos \theta = EI$$
$$= (E_f + E_r)(I_f + I_r)$$

$$= \frac{E_f E_f}{Z_o} - \frac{E_r E_r}{Z_o}$$

$$= \frac{|E_f|^2 - |E_r|^2}{Z_o}$$

$$= \frac{|E_f|^2}{Z_o}(1 - |\rho|^2)$$

$$= \frac{|e^+|^2 - |e^-|^2}{4\omega^2 K^2 Z_o}$$

The prior art instruments utilizing the principles referred to above generally included a coil physically inserted in a line section of suitable size with the coil rotatable through 180° of travel in the field between the outer conductor and inner conductor of the line section in order to sense the magnitude of either the forward voltage wave level or the reflected voltage wave level. The coil was then connected to a conventional analog meter movement with the meter calibrated in watts to give a visual power indication representative of either the forward or reflective voltage wave signals on the transmission line. A detector circuit comprising a diode was provided between the loop and the meter to rectify the wave signal from the coil.

The accuracy of such instrument has been limited by the fact that high speed diodes which form the detector are inherently nonlinear in their current-to-voltage response, and are considerably affected by temperature.

SUMMARY OF THE INVENTION

The present invention overcomes the disadvantages of the prior art instrument and provides other unique advantages which increase the accuracy and reliability of power meters. The present invention uses a self-balancing bridge circuit to provide an accurate power reading from the detector. The nonlinearity and the temperature dependence of the diode detector are avoided by using a secondary balancing diode detector connected in opposition to the principal detector diode. The two diodes are selected so that they are substantially identical, so that diode anomalies are substantially eliminated. In addition, the two diodes are located in the same thermal environment, so that temperature dependence effects are avoided. The secondary balancing diode detector is fed a balancing wave signal which nulls the wave signal from the principal diode detector when the balancing signal matches the measured signal. The amplitude of the balancing signal then corresponds to the power reading.

One advantage of the present invention is that certain nonlinearities and temperature effects on the diode detector are avoided. Diode low-frequency characteristics follow the relationship:

$$I = I_o(e^{V/\eta V_T} - 1)$$

where V is the voltage drop across the junction after the effects of series resistance, and I is the current through the junction. $I_o$ is the reverse saturation current of the diode, and it varies greatly from diode to diode within a lot, as well as varying with changes in temperature. $V_T$ is a function only of absolute temperature, according to:

$$V_T = KT/e \approx 0.026 \text{ volts (at room temperature)}$$

where K is Boltzmann's constant, T is absolute temperature, and e is the electron charge. The parameter $\eta$ takes into account the recombination of carriers in the diode junction transition region. The value of $\eta$ is unity for germanium and similar types of diodes and is approximately 2 for silicon diodes, because such recombination is negligible in germanium but not in silicon. Assuming that $\eta$ is unity, the current through the junction is $$I = I_o(e^{V/V_T} - 1)$$

In accordance with the present invention, there is no d.c. path shunting the diode. Since the diode has no d.c. path shunting it, the forward and reverse currents must be equal when integrated over each cycle of the applied a.c. signal.

$$\int_0^{2\pi} I_o(e^{(A \sin(wt) - V_{dc})/V_T} - 1) dt = 0$$

Since $I_o$ remains constant over the interval 0 to $2\pi$, it may be taken outside the integral and subsequently cancelled from the equation. Hence, $V_{dc}$ is a function only of a.c. amplitude and $V_T$, and $V_T$ is a function only of absolute temperature.

Temperature dependence in diode characteristics is avoided by mounting the principal diode detector and the secondary balancing diode detector in close physical proximity to each other so that they are subjected to the same thermal environment. Since the diodes are connected in opposition to each other, the temperature dependence of the diodes cancels out.

In addition, when the bridge circuit is balanced, the amplitude of the wave signals sent to each diode is equal, so that the effect of a.c. amplitude is also eliminated.

Preferably, both diodes are incorporated in the same pick-up element, so that the thermal effects on both diodes are substantially the same. A balancing wave signal is supplied to the pick-up element to be used by the secondary detector. A difference signal, which results from the imbalance between the two detectors, is sent from the pick-up element and is used by the instrument to adjust the balancing wave signal. Since the pick-up element is usually connected to the rest of the instrument by a single line, the difference signal and the balancing wave signal are combined into a single signal on the line. The balancing signal forms the a.c. component of the single signal, and the difference signal forms the d.c. component of the single signal.

These and other advantages are achieved by the present invention. In accordance with one aspect of the present invention, an electronic instrument is provided for measuring directional RF power levels on a coaxial transmission line. The instrument comprises an inductive sensing loop for sensing the RF voltage levels on the transmission line and producing a first voltage wave signal proportional thereto. Means are provided for generating a second voltage wave signal connected in opposition to the first voltage wave signal from the loop to produce a difference signal. Means are also provided for integrating the difference signal to produce an output signal. Preferably, the magnitude of the output signal is used by the generating means to determine the amplitude for the second voltage wave signal.

In accordance with another aspect of the present invention, an electronic instrument is provided for measuring directional RF power levels on a coaxial transmission line. The instrument is adapted to be inserted in the line. The instrument comprises an inductive sensing loop for sensing the RF voltage on the transmission line and producing an inductive voltage in response thereto. First detector means are provided for translating the inductive voltage from the loop into a sensed voltage wave signal corresponding to power. Second detector means are connected in opposition to the first detector means for supplying a generated voltage wave signal in opposition to the sensed voltage wave signal to produce a difference signal. Means are provided for integrating the difference signal to produce an output voltage level signal corresponding to the power. Means are provided for producing the generated voltage wave signal from the magnitude of the output voltage level signal. The generated voltage wave signal is supplied to the second detector means. Means are also provided for displaying the magnitude of the output voltage level signal.

In accordance with another aspect of the present invention, an electronic instrument is provided which includes line means for connecting the generated voltage wave signal in opposition to the sensed voltage wave signal from the loop. The difference signal is produced thereby. The difference signal and the generated voltage wave signal are parts of a single signal on the line means. The generated voltage wave signal forms the a.c. component of the signal, and the difference signal forms the d.c. component of the signal.

In accordance with another aspect of the present invention, an inductive pick-up element is provided for an RF power meter adapted to be inserted in an opening of a coaxial line section of a coaxial transmission line. The line section has a tubular conductive metal body with a central axis and a transverse opening. The line section also has a coaxial center conductor extending axially through the body and electrically isolated from the body. The element comprises an enclosed body adapted to be inserted in the opening. An inductive pick-up coil is located in the body adjacent to the center conductor of the line section and oriented parallel to the central axis. A first diode rectifier is located in the body and connected to the coil. A second diode rectifier is also located in the body and is connected in opposition to the first diode rectifier. The first and second rectifiers are thus subjected to substantially the same thermal conditions.

DETAILED DESCRIPTION OF THE PREFERRED EMBODIMENT

Figure 1:
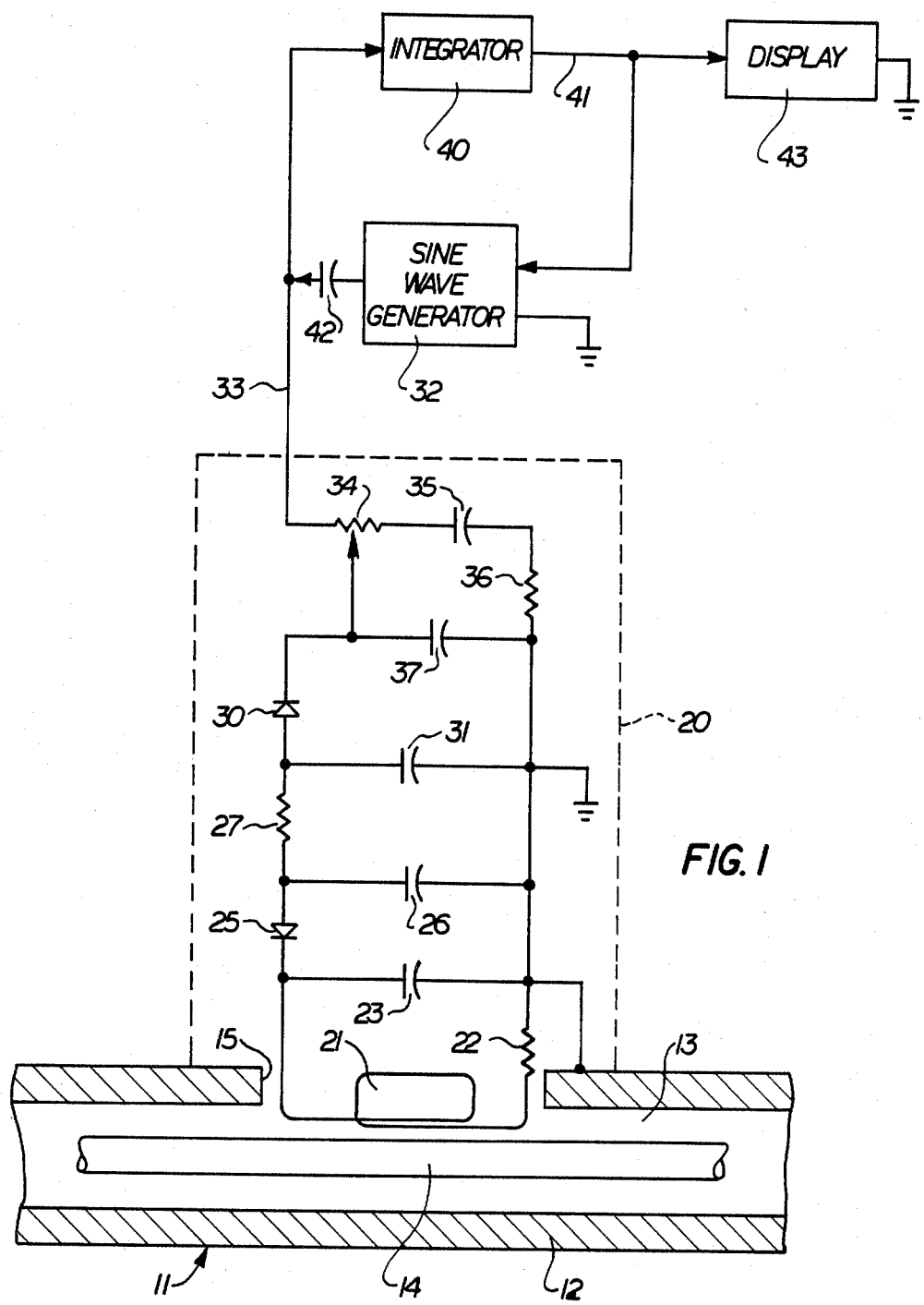
FIG. 1 is a schematic diagram of the instrument of the present invention.

Referring more particularly to the drawings, FIG. 1 shows the radio frequency (RF) directional wattmeter typical of the present invention and adapted for detecting and measuring forward and reflected voltage wave signals on an RF coaxial transmission line. The instrument is adapted to be used with a line section 11 comprising a tubular conductive metal body 12 formed of aluminum, for example, and defining a longitudinally extending cylindrical base 13 therein. Located within the space 13 is a center conductor 14 supported by and electrically insulated from the tubular body 12. The tubular body 12 has a relatively large transverse opening 15 formed therein, communicating with the cylindrical space 13. Located partly within the opening 15 and supported by the metal body 12 is an inductive pick-up element 20. The circuitry of the pick-up element 20 is shown in FIG. 1. The construction of the pick-up element 20 will be described later in more detail with reference to FIGS. 2-4.

Referring to FIG. 1, the pick-up element 20 has an inductive pick-up loop or coil 21 positioned within the space 13. In accordance with known principles, a voltage is induced in the coil 21 which bears a relationship to the power propagated in the coaxial transmission line. A sampling resistor 22 is provided in series with the coil 21. A band-broadening shunt capacitor 23 is connected across the pick-up coil 21 and the sampling resistor 22. The shunt capacitor 23 tunes or resonates the loop circuit in the frequency band and at the sensitivity for which the pick-up element is designed. The loop circuit, thus heavily loaded by the shunt capacitor 23, exhibits broad band characteristics by reason of the sampling resistor 22 which flattens the response curve of the circuit. This capacitive loading of the resistive loop circuit by the shunt capacitor 23 provides wide frequency band operation.

A principal detector 25 comprises a rectifier or diode having its cathode connected to the loop circuit. The diode which comprises the detector 25 may be of the 5082-2800 type manufactured by Hewlett-Packard, which has a recombination parameter value, $\eta$, of unity, as used in the aforementioned equations. A diode charge capacitor 26 is connected between the anode of the principal detector 25 and ground. A diode load resistor 27 is also connected to the anode of the principal detector 25. The charge capacitor 26, along with the load resistor 27, provides the desired time constant to obtain peak reading characteristics.

In accordance with the present invention, a secondary detector 30 is connected in opposition to the principal detector 25. The secondary detector 30 comprises a diode which should be identical in all respects to the diode used as the principal detector 25. A secondary diode charge capacitor 31 is connected between the positive side of the secondary detector 30 and ground. The secondary detector 30 is supplied with a balancing wave signal which is sent to the pick-up element 20 from a sine wave generator 32. The sine wave generator 32 will be described in more detail with reference to FIGS. 5 and 6. The output of the sine wave generator 32 is connected to the pick-up element 20 by means of the line 33. If necessary, the line 33 may be shielded with the other elements of the instrument located a sufficient distance from the pick-up element 20. The cathode of the secondary detector 30 is connected to the line 33 through a calibration potentiometer 34. The potentiometer 34 is used to compensate for variations in the coupling of the coil 21, and it is factory set for each pick-up element 20 so that the element is properly calibrated prior to use. The end of the potentiometer 34 is connected through a capacitor 35 and a resistor 36 to ground. A capacitor 37 is connected between the cathode of the secondary detector 30 and ground and is used to block RF interference received on the line 33.

The diodes comprising the principal detector 25 and the secondary detector 30 are each connected so that there is no d.c. path shunting the diodes. This arrangement permits the reverse saturation current $I_o$ to be factored out of the equations as previously described, so that the value of $I_o$, which varies greatly from diode to diode, does not affect the accuracy of the instrument.

The output of the coil 21 is opposed by the wave signal produced by the sine wave generator 32. The outputs of these two sources are rectified by the detectors 25 and 30. The d.c. components produced by the detectors 25 and 30 are subtracted from each other by virtue of the opposed series arrangement of the detectors. If the signal generated by the sine wave generator 32 exactly matches the output of the coil 21, the d.c. component will be nil and the bridge will be in balance. However, if the two signals do not match, the d.c. component will be supplied to an inverting integrator 40 having its inverting input also connected to the line 33 and having its output connected to a line 41. The d.c. component of the signal on the line 33 is a "difference signal" representing the difference between the signal from the coil 21 and the signal from the sine wave generator 32. The integrator 40 responds to this difference signal or the d.c. component of the signal on the line 33. If the output of the coil 21 is greater than the output of the generator 32, the difference signal supplied on the line 33 to the integrator 40 will be negative, causing the integrator output on the line 41 to ramp upwardly. If the output of the coil 21 is less than the output of the generator 32, the difference signal supplied on the line 33 to the integrator 40 will be positive, causing the output of the integrator on the line 41 to ramp downwardly. The sine wave generator 32 is isolated from this d.c. component by a blocking capacitor 42 located between the output of the generator 32 and the line 33.

Balancing of this bridge is achieved by using the output of the integrator 40 as an input to the sine wave generator 32, so that the amplitude of the wave form produced by the generator is proportional to the integrator output. Thus, if the output of the coil 21 is greater than the output of the generator 32, the difference signal supplied to the integrator 40 on the line 33 will be negative and the integrator output on the line 41 will ramp upwardly. Since the sine wave generator 32 is connected to the line 41 and uses the integrator output to determine the amplitude of the sine wave that it generates, the amplitude of the wave form from the generator 32 will increase until it matches the output of the coil 21. At this point, the bridge will be in balance and the difference signal supplied to the integrator 40 will be nil. Since the amplitude of the wave form generated by the generator 32 is exactly equal to the amplitude of the inducted wave form from the coil 21 when the bridge is in balance, and since this amplitude is proportional to the output of the integrator 40, the integrator output voltage on the line 41 is proportional to the square root of power in the coaxial transmission line. The output of the integrator 40 is thus connected to a display device 43 comprising a meter which is calibrated to provide a power reading in watts.

The signal on the line 33 thus carries two kinds of information. The a.c. component of the signal on the line 33 is a sine wave produced by the generator 32 having an amplitude equal to the output of the integrator 40. The d.c. component of the signal on the line 33 is a difference signal produced by the pick-up element 20 signifying the level which the output of the generator 32 is out of balance with the output of the coil 21. The a.c. component of the signal on the line 33 is used as an input to the secondary detector 30 to oppose the inductive input to the principal detector 25. The d.c. component of the signal on the line 33 is used by the integrator 40 to correct the signal on the line 41.

Figure 2:
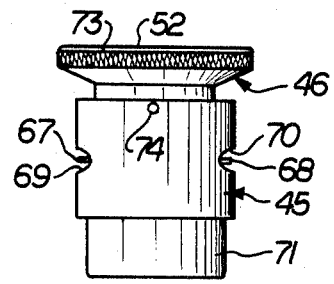
FIG. 2 is a side elevational view of the pick-up element used in the instrument of FIG. 1.
Figure 3:
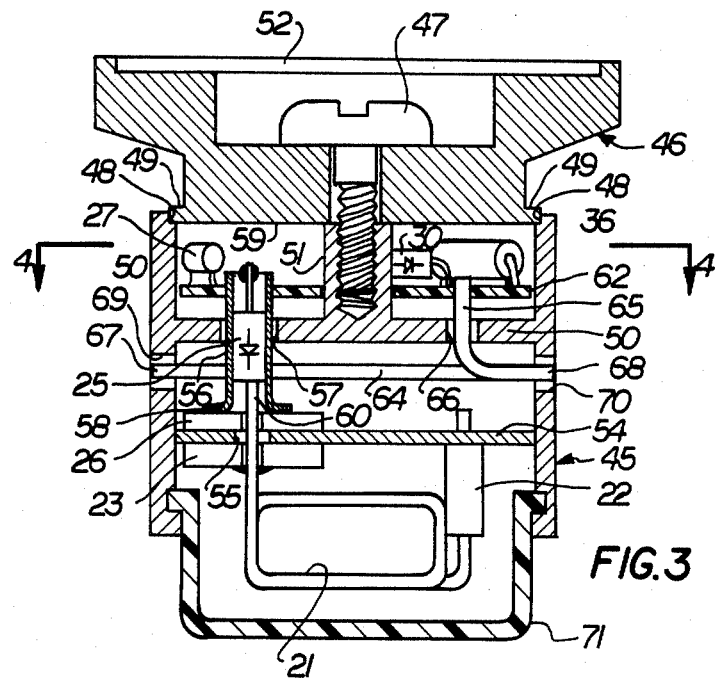
FIG. 3 is a cross-sectional view of the pick-up element of FIG. 2 to a larger scale.
Figure 4:
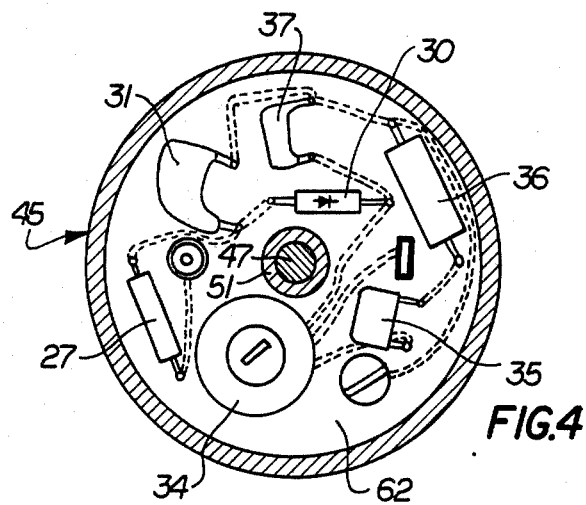
FIG. 4 is a sectional plan view of the pick-up element taken along line 4—4 of FIG. 3.

The construction of the pick-up element 20 is shown in greater detail in FIGS. 2–4. Referring to FIG. 2, the size and outer configuration of the pick-up element 20 conforms to the pick-up elements previously used in directional wattmeters of the type disclosed in U.S. Pat. Nos. 2,852,741 and 2,891,221. The unit 20 comprises a hollow cylindrical body 45 with a mating cap 46 connected by suitable means such as a single centrally located axial machine screw 47 (FIG. 3). The cylindrical body 45 and the cap 46 are machined from brass or similar material. The body 45 and the cap 49 are interfitted, one of the members, preferably the body 45, having a shouldered groove 48 adapted to receive a circular flange 49 of the other member or cap 46. The cylindrical body 45 has a transverse web portion or wall 50 formed therein. The wall 50 has a central threaded portion 51 for receiving the cap-securing screw 47. A thin cover plate 52 extends on top of the cap 46 and covers the head of the screw 47. The cover plate 52 has on it printed information identifying the range and type of the pick-up element.

The inductive pick-up loop or coil 21 is located within the body 45 at the end opposite the cap 46 and adjacent to the coaxial transmission line. One end of the coil 21 is connected to the sampling resistor 22. The other end of the resistor 22 is soldered to a mounting plate or disc 54. The mounting disc 54 is circular to fit within the hollow chamber formed within the body 45 and is composed of suitable metal which is a good electrical conductor, such as brass. The detector shunt capacitor 23 and the detector charge capacitor 26 are of the flat annular type and are mounted against the lower and upper surfaces respectively of the conductive mounting disc 54 coaxial with an eccentrically located opening 55 in the disc. A longitudinally slotted spring metal sleeve 56 is provided adjacent to the capacitor 26. The sleeve member 56 extends through an opening 57 in the transverse body wall 50. The sleeve 56 has an outwardly directed radial flange 58 adapted to make electrical contact with the upper plate of the capacitor 26 to which it is soldered. The detector 25 is preferably a 5082-2800 diode manufactured by Hewlett-Packard and has an anode or positive terminal 59 and a cathode or negative terminal 60. The positive terminal 59 is soldered to the upper end of the sleeve 56. The sleeve 56 electrically connects the positive terminal 59 of the diode detector 25 to the upper surface of the capacitor 26 and helps to support the diode.

The lower plate of the capacitor 26 is soldered to and makes electrical contact with the mounting disc 54. The capacitor 23 may likewise have upper and lower plates, one lying against and soldered to mounting disc 54, and thereby making an electrical contact therewith. The other plate of the capacitor 23 is connected to one end of the coil 21.

The diode detector 25 is in its assembled position with its supporting sleeve 56 and coaxial to the capacitors 23 and 26 on the conductor disc 54, the cathode or negative terminal 60 of the diode detector 25 passing through both capacitors 23 and 26 without making electrical connection with the capacitor 26 and being only connected to the under side of the capacitor 23.

A printed circuit board 62 is supported on the transverse body wall 50. One end of the sleeve 56 extends through an opening in circuit board 62 and is soldered thereto to make an electrical connection. As shown in FIG. 4, the printed circuit board provides a mounting and connection medium for the diode forming the secondary detector 30, the secondary charge capacitor 31, the secondary shunt capacitor 37, the potentiometer 34, the capacitor 35, and the resistor 36. All of these elements are connected by a printed circuit on the lower side of the circuit board 62 in accordance with the connections shown in FIG. 1.

A connection strip 64 is provided within the body 45 on the opposite side of the transverse wall 50 from the circuit board 62. The connection strip 64 is cut out centrally and the cut-out piece or a portion thereof is bent upwardly at a right angle to provide an integral tab 65 which extends through an opening 66 in the transverse body wall 47, and through an opening in the printed circuit board 62 and is soldered therein. The connection strip 64 also has a pair of composite contact ears 67 and 68 projecting in diametrical relationship through slots 69 and 70 cut 180° apart in the cylindrical walls of the body 45 (FIGS. 2 and 3). The slots 69 and 70 are large enough to provide insulating clearance around the projecting contact ears 67 and 68. The ears 67 and 68 provide a connection for the pick-up element 20 with the rest of the instrument.

For protecting the inductive coil 21, particularly when the pick-up element 20 is removed for replacement by a different element having a different frequency range, a cover 71 of insulating plastic, such as polytetrafluoroethylene (Teflon), is preferably provided in the form of a cup having a cavity of sufficient size to receive the coil 21 and the resistor 22.

The cap 46 is provided with a knurled rim 73 (FIG. 2) to facilitate rotating the pick-up unit 20 through an angle of 180° in order that the coil 21 may be oriented to the electromagnetic field in the coaxial transmission line in either forward or reverse position for detecting either forward or reflected power. In order to fix the limits of rotation of the cap 49, a radially projecting pin 74 is brazed in a slot provided in the edge of the cap flange 49, the pin projecting through a notch in the upper edge of the circular wall of the body 45 and being adapted to cooperate with stop shoulders formed in the instrument.

It is apparent that the principal detector 25 and the secondary detector 30, by reason of both being physically located within the body 45, will be subjected to essentially the same thermal conditions during the operation of the inductive pick-up element 20. Therefore the thermal characteristics of the diodes of each detector 25 and 30 will be essentially the same.

Figure 5:
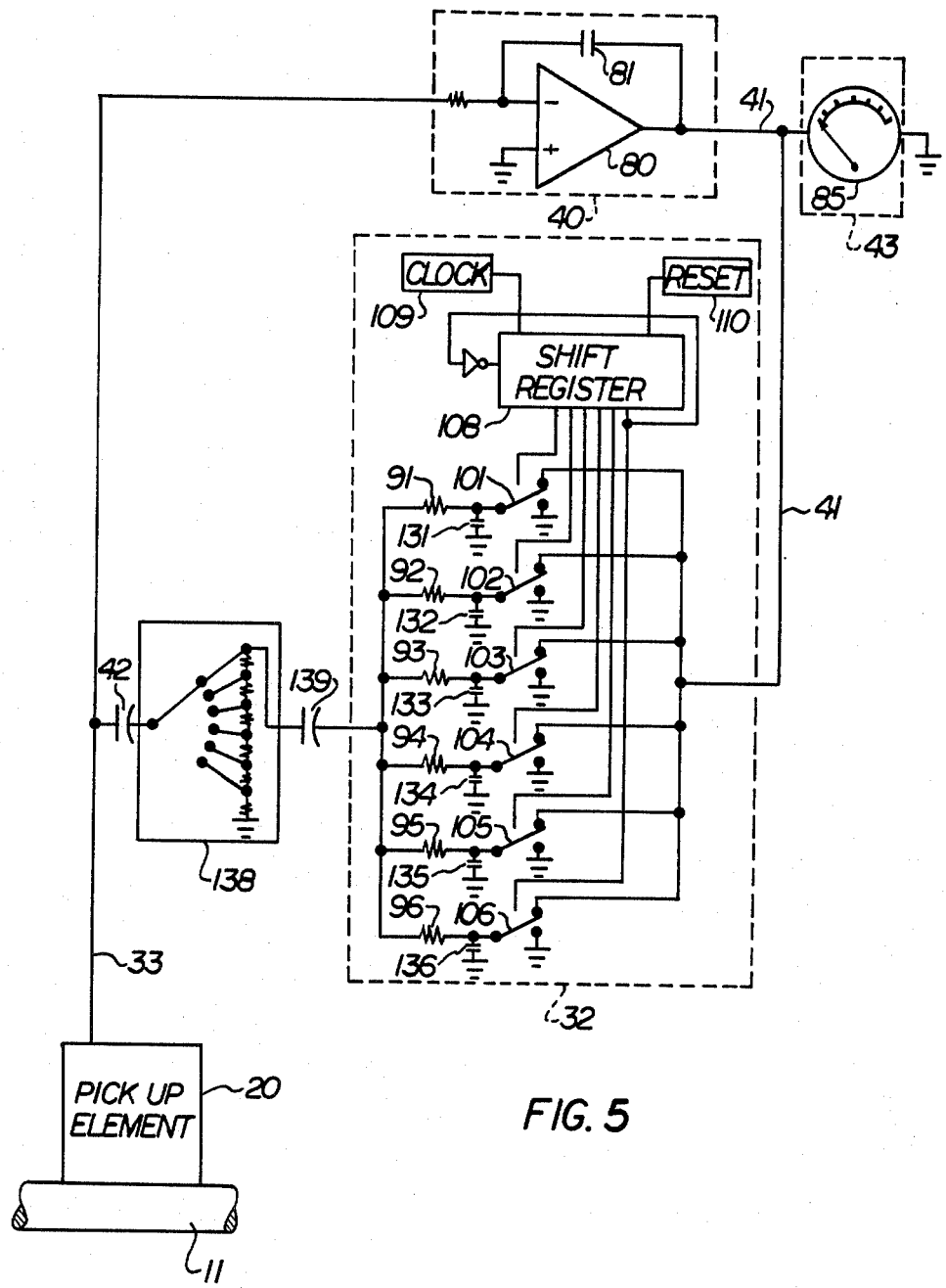
FIG. 5 is a schematic diagram of the instrument, similar to FIG. 1, showing certain elements in greater detail.

Referring to FIG. 5, the pick-up element 20 is connected by the line 33 to the sine wave generator 32 and the integrator 40. As previously described, the generator 32 produces a wave signal which is the a.c. component of the signal supplied to the pick-up element 20 on the line 33. The generated wave signal from the generator 32 opposes the wave signal from the coil 21 of the pick-up element 20 producing a difference signal which is the d.c. component of the signal on the line 33. This difference signal is supplied to the integrator 40, and specifically to the inverting input of an operational amplifier 80. Preferably, the amplifier 80 comprises a 3130 integrated circuit device, which is a CMOS operational amplifier manufactured by RCA. The noninverting input of the amplifier 80 is grounded, and the output of the amplifier is connected back to the inverting input through a capacitor 81 so that the amplifier 80 functions as an integrator. When the bridge is in balance, i.e., when the output of the generator 32 balances the output of the coil 21, the output of the amplifier 80, which is the integrated difference signal received on the line 33, matches the amplitude of the wave signal from the pick-up coil 21. This output is then supplied on the line 41 to a display device 43, which may be, for example, a D'Arsonval meter movement assembly 85 which is calibrated to provide a power reading in watts. The signal on the line 41 from the output of the operational amplifier 80 causes the needle of the meter 85 to deflect across the meter scale to provide a power reading.

The sine wave generator 32 comprises a number of resistors 91–96 connected in parallel between the lines 33 and 41. Each of the resistors 91–96 is selectively connected to the output of the amplifier 80 by a number of switches 101–106. The switches 101–106 are operated by a walking-ring counter provided by a shift register 108. The shift register 108 is sequentially activated by a clock 109 and the walking-ring is initiated by a reset circuit 110.

Figure 6:
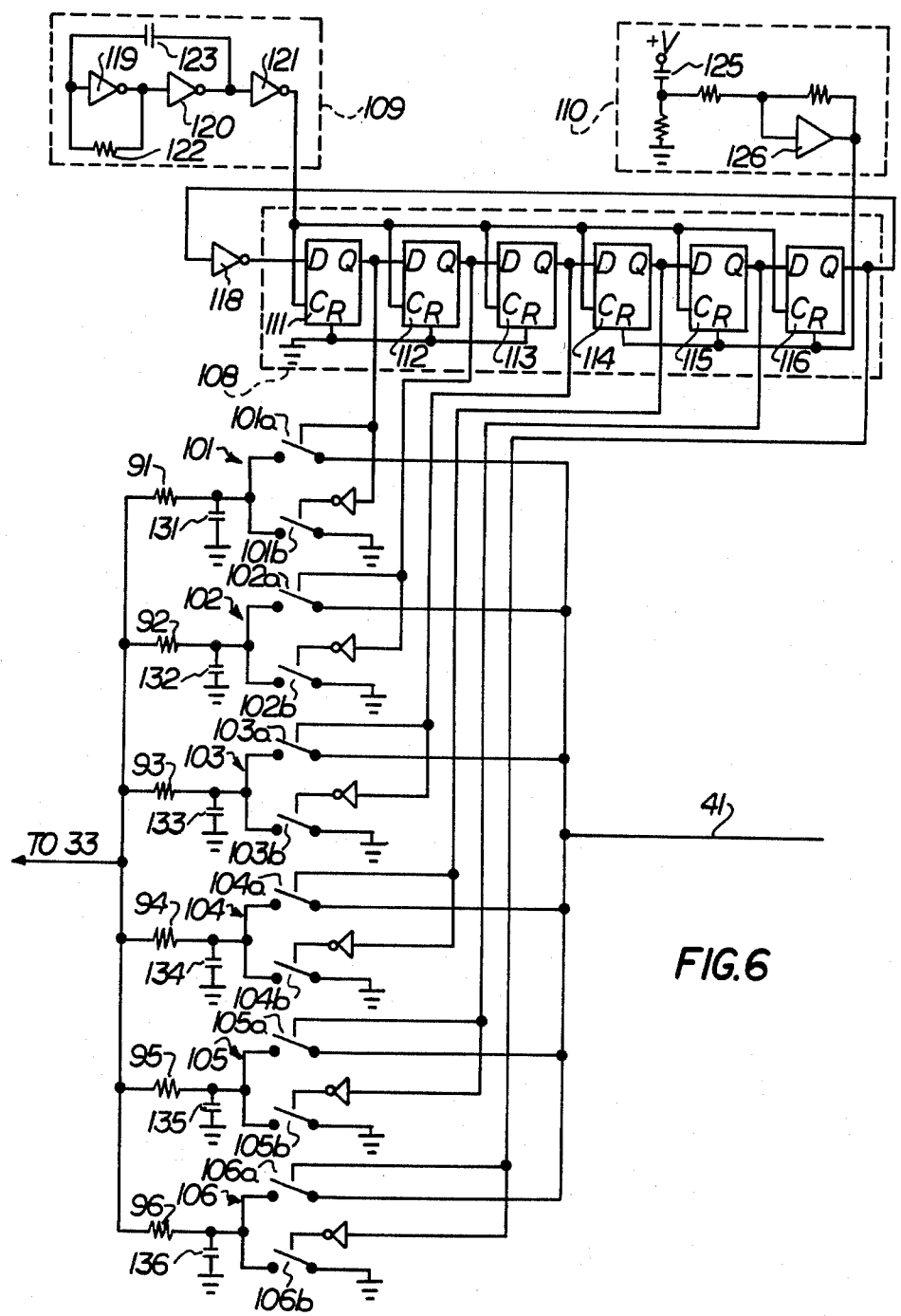
FIG. 6 is a circuit diagram showing a portion of the components of FIG. 5 in greater detail.

The relationship between the elements in the sine wave generator 32 is shown in more detail in FIG. 6. The shift register 108 may be formed of any suitable solid state device. Preferably, shift register is formed from a 4015 integrated circuit device. As shown in FIG. 6, the shift register 108 is formed from a number of interconnected type-D flip-flops 111–116, in which the output Q of each flip-flop is connected to the input D of the adjacent flip-flop. The output Q of the last flip-flop 116 is connected to the input D of the first flip-flop 111 through an inverter to form a walking-ring counter 118. The actuation of the shift register 108 is controlled by the clock circuit 109 comprising three serial inverters 119, 120, and 121. A resistor 122 is connected in parallel around the inverter 119, and a capacitor 123 is connected in parallel around the inverters 119 and 120. By selecting the proper resistance for the resistor 122 and the proper capacitance for the capacitor 123, any desired time constant can be selected for the clock circuit 109.

The reset R of some of the flip-flops of the shift register 108 is grounded, but at least one reset R is connected to the reset circuit 110. The reset circuit 110 includes a capacitor 125 connected between a positive voltage source and ground. The output of the reset circuit 110 is connected to the grounded side of the capacitor 125 through a buffer 126. During initial start up of the instrument, a high level voltage output is received from the reset circuit 110. After the capacitor 125 charges, the output of the reset circuit 110 is grounded and a low level input is provided to the resets R of the flip-flops 114–116. The shift register 108 is thus provided with an initial high level input to the reset R of some of the flip-flops during the start-up of the instrument, so that the output Q of some of the flip-flops is forced to ground during instrument startup. After the capacitor 125 charges and the output of the reset circuit 110 is grounded, the reset R for all of the flip-flops 111-116 is grounded and the shift register 108 operates as a walking-ring counter.

The set of switches 101–106 may be formed from a 4053 integrated circuit device. Each of the switches 101–106 actually comprises two analog switches 101a–106a and 101b–106b. Each of the analog switches 101a–106a is operated by the output Q of one of the flip-flops 111–116 of the shift register 108 to connect one of the resistors 91–96 to the line 41. Each of the other analog switches 101b–106b is operated by the inverse of the output Q from one of the flip-flops 111–116 to selectively connect one of the resistors 91–96 to ground. The values of the resistors 91–96 are chosen so that the parallel combination of connective resistors forms a stepped wave form which resembles a sine wave as the walking-ring counter formed by the shift register 108 selectively opens and closes the switches 101–106. The resulting stepped-wave form is smoothed by a filter comprising capacitors 131–136 connected between each resistor 91–96 and ground.

In the preferred embodiment of FIG. 6, six resistors 91–96 are used, and the connection of the resistors is controlled by a six-stage shift register 108. In the preferred embodiment, the shift register 108 is disclosed as a 4015 integrated circuit device. It is noted that the 4015 device contains eight flip-flops and that two stages are not used, so that the sixth flip-flop of the 4015 device is connected back to the first flip-flop of the element. If desired, a greater or lesser number of resistors may be used in the sine wave generator 32 in order to achieve a more precise sine wave or to provide a simpler circuit.

Preferably, the amplifier 80, the shift register 108, the switches 101–106, and the elements of the clock circuit 109 and the reset circuit 110 are all made from available CMOS integrated circuit devices. The inverters 118, 119, 120, and 121 may be formed from portions of a 4584 integrated circuit. In addition, the buffer 126 may be comprised of two serially-connected inverters from the 4584 device.

As shown in FIG. 5, the output of the sine wave generator is preferably connected to the line 33 through a range selector switch 138. The range selector switch 138 is a potentiometer which provides selective additional resistance in series with the selected resistors 91–96. Blocking capacitors 42 and 139 are provided on each side of the range selector switch 138.

Various modifications may be made to the basic invention herein shown and described. For example, instead of using an analog D'Arsonval meter 85 to form the display device 42, a digital display device may be used, in which case a suitable analog-to-digital converter may be employed, such as that disclosed in U.S. Pat. No. 4,263,653. Such an a-d converter utilizes a microcomputer as disclosed in the aforementioned patent. By employing a microcomputer, it is also possible to achieve the other advantages described in the aforementioned patent in order to increase the capabilities of the instrument. For example, the instrument can automaticaly measure and calculate VSWR and display VSWR values digitally.

While the invention has been shown and described with respect to a specific embodiment thereof, it is intended for the purpose of illustration rather than limitation, and other modifications and variations in the specific form herein shown and described will be apparent to those skilled in the art, all within the intended sphere and scope of the invention. Accordingly, the patent is not to be limited in scope and effect to the specific embodiment herein shown and described, nor in any other way that is inconsistent with the extent to which the progress in the art has been advanced by the invention.

What is claimed is:

1. An electronic instrument for measuring RF power levels on a coaxial transmission line comprising:
   means for sensing the RF voltage levels on the transmission line and producing a first voltage wave signal proportional thereto;
   first detector means for translating the first voltage wave signal from the sensing means into a sensed voltage wave signal corresponding to power in the transmission line;
   means for generating a second voltage wave signal;
   second detector means connected in opposition to the first detector means for translating the second voltage wave signal and supplying it in opposition to the sensed voltage wave signal to produce a difference signal;
   means connecting the generating means and the second detector means, the connecting means comprising a line carrying a single composite signal, the second voltage wave signal and the difference signal forming parts of the single composite signal; and
   means connected to the connecting means for integrating the difference signal to produce an output signal.

2. An electronic instrument as defined in claim 1, wherein the sensing means comprises an inductive sensing loop.

3. An electronic instrument as defined in claim 1, wherein the magnitude of the output signal is used by the generating means to determine the amplitude of the second voltage wave signal.

4. An electronic instrument as defined in claim 1, wherein there is no d.c. path shunting either detector means.

5. An electronic instrument as defined in claim 1, wherein the first detector means and the second detector means are located in physical proximity to each other and are subjected to the same thermal environment.

6. An electronic instrument as defined in claim 1, wherein the single composite signal has an a.c. component and a d.c. component, the second voltage wave signal forming the a.c. component of the single composite signal and the difference signal forming the d.c. component of the single composite signal.

7. An electronic instrument for measuring RF power levels on a coaxial transmission line, the instrument adapted to be inserted in the line, the instrument comprising:
   an inductive sensing loop for sensing the RF voltage on the transmission line and producing a voltage signal in response thereto;
   first detector means for translating the voltage signal from the loop into a sensed voltage wave signal corresponding to power in the transmission line;
   second detector means connected in opposition to the first detector means for translating a generated voltage wave signal and supplying it in opposition to the sensed voltage wave signal to produce a difference signal;
   means for integrating the difference signal to produce an output voltage level signal corresponding to power;
   means for producing the generated voltage wave signal from the magnitude of the output voltage level signal, the generated voltage wave signal being supplied to the second detector means;
   line means connecting the second detector means to the integrating means and to the producing means, the line means comprising a line carrying a single composite signal, the generated voltage wave signal forming one part of the single composite signal, and the difference signal forming the other part of the single composite signal; and
   means for displaying the magnitude of the output voltage level signal.

8. An electronic instrument as defined in claim 7, wherein there is no d.c. path shunting either detector means.

9. An electronic instrument as defined in claim 7, wherein the amplitude of the generated voltage wave signal is proportional to the magnitude of the output voltage level signal.

10. An electronic instrument as defined in claim 7, wherein the first detector means and the second detector means are contained in an enclosed body and are located in close physical proximity to each other and are subjected to the same thermal environment.

11. An electronic instrument as defined in claim 8, wherein the single signal supplied on the line means has an a.c. component and a d.c. component, the generated wave signal forming the a.c. component of the single composite signal, and the difference signal forming the d.c. component of the single composite signal.

12. An electronic instrument for measuring RF power levels on a coaxial transmission line, comprising:

an inductive sensing loop for sening RF voltage levels on the transmission line and producing a first voltage wave signal proportional thereto;

first detector means for translating the first voltage wave signal from the loop into a sensed voltage wave signal corresponding to power on the transmission line;

means for generating a second voltage wave signal;

second detector means connected in opposition to the first detector means for translating the second voltage wave signal and supplying it in opposition to the sensed voltage wave signal to produce a difference signal;

line means for connecting the generating means and the second detector means, the line means carrying a signal having a d.c. component and a.c. component, the difference signal forming the d.c. component of the signal on the line means, and the second voltage wave signal forming the a.c. component of the signal on the line means; and means connected to the line means for integrating the difference signal to produce an output signal.

13. An electronic instrument as defined in claim 12, wherein the magnitude of the output signal is used by the generating means to determine the amplitude of the second voltage wave signal.

14. An electronic instrument as defined in claim 12, wherein there is no d.c. path shunting either detector means.

15. An electronic instrument as defined in claim 12, wherein the first detector means and the second detector means are located in physical proximity to each other and are subjected to the same thermal environment.

16. An inductive pick-up element for an RF power meter adapted to be inserted in an opening of a coaxial line section having a tubular conductive metal body with a central axis and a transverse opening, and a coaxial center conductor extending axially through said body and electrically isolated therefrom, the element comprising:

a body adapted to be inserted in the opening, the body adapted to be connected to line means carrying a single signal;

an inductive pick-up coil located in the body adjacent to the center conductor of the line section and oriented parallel to the central axis, the coil sensing RF voltage levels in the line section and producing a first voltage wave signal proportional thereto;

a first diode rectifier located in the body and connected to the coil, the first diode rectifier converting the first voltage wave signal from the loop into a sensed voltage wave signal; and a second diode rectifier located in the body, the second diode rectifier connected to the line means and connected in opposition to the first diode rectifier, the second diode rectifier adapted to convert a second voltage wave signal on the line means to a generated voltage signal which is supplied in opposition to the sensed voltage wave signal to produce a difference signal, the difference signal and the second voltage wave signal both forming components of the single signal carried by the line means.

17. An inductive pick-up element as defined in claim 16, wherein there is no d.c. path shunting either diode rectifier.

18. An electronic instrument for measuring RF power levels on a coaxial transmission line, comprising:

an inductive pick-up element as defined in claim 16;

means for generating the second voltage wave signal supplied to the pick-up element on the line means;

means for integrating the difference signal received on the line means from the pick-up element to produce an output voltage level signal corresponding to power on the transmission line; and means for displaying the magnitude of the output voltage level signal.

19. An electronic instrument as defined in claim 18, wherein the magnitude of the output voltage level signal is used by the generating means to determine the amplitude of the voltage wave signal.

20. An electronic instrument as defined in claim 18, wherein the single signal on the line means has an a.c. component and a d.c. component, the second voltage wave signal forming the a.c. component of the single signal, and the difference signal forming the d.c. component of the single signal.

* * * * *